United States Patent
Kawabe et al.

[11] Patent Number: 5,948,587
[45] Date of Patent: *Sep. 7, 1999

[54] POSITIVE WORKING PHOTORESIST COMPOSITION

[75] Inventors: Yasumasa Kawabe; Shiro Tan, both of Shizuoka, Japan

[73] Assignee: Fuji Photo Film Co., Ltd., Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/713,997

[22] Filed: Sep. 19, 1996

[30] Foreign Application Priority Data

Sep. 22, 1995 [JP] Japan .................................. 7-244703

[51] Int. Cl.$^6$ ........................................ G03F 7/023
[52] U.S. Cl. ...................... 430/191; 430/165; 430/192; 430/193
[58] Field of Search ................................ 430/165, 191, 430/192, 193

[56] References Cited

U.S. PATENT DOCUMENTS

| | | | |
|---|---|---|---|
| 4,812,551 | 3/1989 | Oi et al. | 430/192 |
| 4,906,549 | 3/1990 | Asaumi et al. | 430/192 |
| 4,988,601 | 1/1991 | Ushirogouchi et al. | 430/192 |
| 5,019,479 | 5/1991 | Oka et al. | 430/192 |
| 5,110,706 | 5/1992 | Yumoto et al. | 430/191 |
| 5,340,686 | 8/1994 | Sakaguchi et al. | 430/191 |
| 5,376,497 | 12/1994 | Kawata et al. | 430/192 |
| 5,403,696 | 4/1995 | Hioki et al. | 430/192 |
| 5,407,780 | 4/1995 | Hioki et al. | 430/192 |
| 5,447,825 | 9/1995 | Nishi et al. | 430/192 |
| 5,554,481 | 9/1996 | Kawabe et al. | 430/192 |

FOREIGN PATENT DOCUMENTS

| | | |
|---|---|---|
| 0239423 | 9/1987 | European Pat. Off. . |
| 0365318 | 4/1990 | European Pat. Off. . |
| 0496640 | 7/1992 | European Pat. Off. . |

*Primary Examiner*—John S. Chu
*Attorney, Agent, or Firm*—Sughrue, Mion, Zinn, Macpeak & Seas, PLLC

[57] ABSTRACT

Provided is a positive working photoresist composition comprising (A) an alkali-soluble novolak resin obtained by condensation reaction of a mixture of phenols, which are constituted of specified proportions of m-cresol and two kinds of specific phenols, with an aldehyde and having a Mw/Mn ratio of from 1.5 to 4.0 (wherein Mw stands for a weight-average molecular weight, and Mn stands for a number-average molecular weight); (B) a 1,2-naphthoquinonediazide-5-(and/or -4-)sulfonic acid ester as a photosensitive material; and (C) a low molecular weight compound having from 12 to 50 carbon atoms per molecule and from 2 to 8 phenolic hydroxy groups per molecule.

7 Claims, No Drawings

POSITIVE WORKING PHOTORESIST COMPOSITION

FIELD OF THE INVENTION

The present invention relates to a positive working photoresist composition which comprises an alkali-soluble novolak resin, a 1,2-quinonediazide compound and a specified compound as a low molecular weight additive and is responsive to radiations such as ultraviolet rays, deep ultraviolet rays, X-rays, electron beams, molecular beams, γ-rays or cyclotron radiation. More particularly, the invention is concerned with a photoresist composition suitable for use in fine processing which has wide development latitude and high sensitivity as well as satisfactory resolution, defocus latitude and heat resistance.

The present photoresist composition is typically applied to production of semiconductor devices, such as IC, and circuit substrates for liquid crystals, thermal heads and the like, and to other photofabrication processes.

BACKGROUND OF THE INVENTION

A generally used positive working photoresist composition comprises an alkali-soluble resin and a naphthoquinonediazide compound as a photosensitive material. For instance, the combinations of novolak-type phenol resins with naphthoquinonediazido-substituted compounds are disclosed, e.g., in U.S. Pat. Nos. 3,666,473, 4,115,128 and 4,173,470, and the combinations of novolak resins prepared from cresols and formaldehyde with trihydroxybenzophenone-1,2-naphthoquinonediazide sulfonic acid esters are described as most typical compositions in L. F. Thompson, *Introduction to Microlithography*, No. 219, pp. 112–121, ACS publishing.

Novolak resins as binder are particularly useful for the present purposes, because they are soluble in aqueous alkali solutions without swelling therein and can provide high resistance to etching, especially to plasma etching, when the images formed therefrom are used as etching mask. In addition, naphthoquinonediazide compounds used as photosensitive material are unique in having a property that the compounds themselves function as dissolution inhibitor to lower the solubility of a novolak resin in alkali, but, when irradiated with light, they decompose to produce alkali-soluble substances, and thereby to rather promote dissolution of a novolak resin in alkali. Owing to such a great change produced in property by light, naphthoquinonediazide compounds are particularly useful as the photosensitive material of positive working photoresist compositions.

From these points of view, a large number of positive working photoresist compositions comprising a novolak resin and a photosensitive material of naphthoquinonediazide type have hitherto been developed and put to practical use. In the processing of fine patterns having a line width of the order of 1 μm at the thinnest, those compositions have accomplished satisfactory results.

With respect to integrated circuits, on the other hand, the integration degree thereof has become higher and higher in recent years. Thus, processing of superfine patterns having a line width of no broader than 1 μm, particularly no broader than 0.5 μm, has come to be required in the manufacture of semiconductor substrates for VLSI and the like. In order to answer such a purpose, it is required for photoresist to have very high resolution, wide defocus latitude, highly precise reproducibility of pattern shape by which exact copying of the shape of an exposure mask is enabled, and wide development latitude enough to ensure a consistent line width upon processing. In order to achieve high productivity, it is further required for the photoresist to have high sensitivity. In addition, the resist is required to have high heat resistance. This is because dry etching processes are supplanting conventional wet etching processes for the purpose of heightening the integration degree of integrated circuits, and dry etching involves a rise of the resist temperature to cause thermal deformation of the resist.

Hitherto, the use of resist having a high γ value has been considered to be advantageous for heightening resolution and reproducing an image of desirable pattern shape, and so the art of resist compositions capable of answering such purposes have been developed. Thus, there are known a large number of patents and reports disclosing such an art. In particular, many applications have been made for patents with respect to the art of novolak resins as a main component of positive working photoresist, including their monomer compositions, molecular weight distributions and syntheses methods, and those patents have accomplished certain results. However, the drawback of being low in sensitivity is common to most of such high resolution resists. As the art of heightening the sensitivity, on the other hand, the addition of low molecular weight compounds having alkali-soluble groups as dissolution accelerator is disclosed, but on the contrary the addition of such compounds often brings about the problems of narrowing the development latitude, lowering the heat resistance and so on. Further, many of those compounds have disadvantages of impairing the pattern shape and so on.

Thus, it is desired to discover resists having not only wide development latitude but also high sensitivity and satisfactory resolution, defocus latitude and heat resistance. The term "development latitude" as used herein can be defined as the dependence of a line width of the developed resist upon the development time or the development temperature. The term "defocus latitude" as used herein can be expressed in terms of the change caused in a resist line width by a shift of the position on which the focus is taken, or in terms of the focus range at which a resist pattern isolates without decreasing film thickness.

SUMMARY OF THE INVENTION

Therefore, an object of the present invention is to provide a positive working photoresist composition which has a wide development latitude and high heat resistance as well as high resolution and a wide defocus latitude, and that without loss of sensitivity.

As a result of our intensive studies with consideration for the aforementioned characteristics, it has been found that the molecular weight distribution, or the ratio of a weight-average molecular weight Mw to a number-average molecular weight Mn (a dispersion degree), is of importance to a novolak resin obtained using special species of monomers (phenols), and further it is important to the aforesaid novolak resin to be mixed with specified phenolic compound and photosensitive material in their appropriate ranges of proportions.

More specifically, the object of the present invention is attained with a positive working photoresist composition comprising:

(A) an alkali-soluble novolak resin which is obtained by condensation reaction of the following phenol compounds (a), (b) and (c) with an aldehyde and has a Mw/Mn ratio of from 1.5 to 4.0 (wherein Mw stands for a weight-average molecular weight and Mn stands for a number-average molecular weight), (a) m-cresol: 50 to 90 mol %
(b) a phenol compound represented by formula (I): 5 to 40 mol %
(c) a phenol compound chosen from formula (II) or (III): 0 to 40 mol %

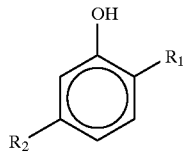

(I)

wherein $R_1$ and $R_2$ each represent a methyl group or an isopropyl group, but at least either of them is an isopropyl group,

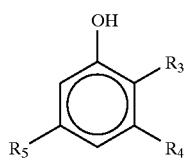

(II)

wherein $R_3$, $R_4$ and $R_5$ each represents a methyl group or a hydrogen atom, but at least two of them are methyl groups, and

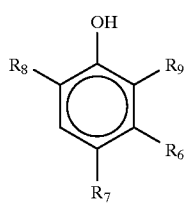

(III)

wherein $R_6$ represents a hydrogen atom or a methyl group, $R_7$ represents a methyl group or a methoxy group, and $R_8$ and $R_9$ each represents a hydrogen atom or a hydroxymethyl group;

(B) a 1,2-naphthoquinonediazide-5-(and/or -4-)sulfonic acid ester as a photosensitive material in a proportion of from more than 30 to less than 100 parts by weight to 100 parts by weight of said novolak resin (A); and (C) a low molecular weight compound which contains from 12 to 50 carbon atoms in the molecule and has from 2 to 8 phenolic hydroxy groups in the molecule in a proportion of from more than 20 to less than 60 parts by weight to 100 parts by weight of said novolak resin (A).

Herein, the molecular weight of the aforementioned novolak resin is defined as the value calculated in polystyrene equivalent, which is determined by gel permeation chromatography (which is abbreviated as GPC, hereinafter).

Additionally, the relationships between conventional arts and the present invention is explained below:

Numerous novolak resins using a cresol as a monomer species have so far been disclosed, e.g., in JP-A-58-17112 (The term "JP-A" as used herein means an "unexamined published Japanese patent application"), JP-A-60-57339, JP-A-62-14148, JP-A-62-35347 and JP-A-62-35349, and many of them are put in practical use.

Also, numbers of novolak resins using monomer species other than a cresol have been proposed with the intention of making improvements in resolution, heat resistance, profile and so on. For instance, the novolak resins disclosed, e.g., in JP-A-60-176034, JP-A-60-164740 and JP-A-64-50044 comprise a xylenol or trimethylphenol as a monomer species, the novolak resin disclosed in JP-A-62-260145 comprises an ethylphenol as a monomer species, the novolak resin disclosed in JP-A-62-260146 comprises 2-methyl-4-isopropylphenol as a monomer species, and the novolak resins comprising a methoxyphenol or dimethoxyphenol as a monomer species have already been proposed by the present inventors (in JP-A-2-93651). In addition, many proposals on novolak resins using monomer species other than the above-cited ones have hitherto been advanced.

On the other hand, attempts to improve upon resist characteristics by giving a special molecular weight distribution to a novolak resin have already been made. For instance, it is described in JP-A-1-105243 that it is preferable for a novolak resin to have a molecular weight distribution such that the proportion of resin molecules having their molecular weight in the range of 500 to 5,000 is not more than 30%. In addition, it is shown in JP-A-62-227144 and JP-A-63-2044 that there are desirable limits to the proportion of resin molecules having their molecular weight in a particular region of the molecular weight distribution. Further, the novolak resins free from low molecular weight components by having undergone fractionation treatment are described in JP-A-60-97347 and JP-A-60-189739, and the use of resins having such a dispersion degree of no greater than 3 as adopted in the present invention also are described in JP-A-60-45238, JP-A-3-208054, JP-A-5-142770, JP-A-60-140235 and so on.

Also, low molecular weight compounds containing aromatic hydroxyl groups, which can be used in the present invention, are generally used as dissolution accelerator for the purpose of heightening the sensitivity and so on, and the addition of such compounds to resist compositions is disclosed in many patents. For example, JP-A-61-141441 discloses the positive working photoresist composition in which trihydroxybenzophenone is present. The addition of trihydroxybenzophenone can bring about improvements upon the sensitivity and developability of a positive working photoresist, but the heat resistance and the profile are deteriorated thereby.

As measures to heighten the sensitivity without deterioration of heat resistance, the addition of aromatic polyhydroxy compounds other than trihydroxybenzophenone is presented in JP-A-64-44439, JP-A-1-177032, JP-A-1-280748, JP-A-2-10350, JP-A-3-200251, JP-A-3-191351, JP-A-3-200255, JP-A-4-299348 and JP-A-5-204144.

However, such compounds added have a common disadvantage of causing an increase in reduction of the film thickness in unexposed areas to result in deterioration of resist pattern shape. Further, they generally narrow the development latitude since they function so as to increase the development speed. Therefore, structures appropriate for aromatic polyhydroxy compounds have been chosen with consideration for the minimum of such disadvantages.

On the other hand, the effects of the present invention are specific ones which can be achieved only by using a particular novolak resin, setting limits to a molecular weight distribution of the novolak resin used and, what is more, adding a low molecular weight compound as described hereinbefore in a prescribed amount.

More specifically, much to our surprise, it has been found that the combination of such a low molecular weight compound with the novolak resin specified in the present invention can provide a wider development latitude than the independent use of either of the two: while, as expected, it has turned out that the combination specified in the present invention can heighten the sensitivity of the resultant resist due to the dissolution accelerating effect of the low molecular weight compound.

Further, it has turned out that the combination specified in the present invention can be superior in resolution, defocus latitude and heat resistance to the compositions previously proposed by the present inventors (in JP-A-2-93651, JP-A-4-296755, JP-A-4-251257 and JP-A-4-122938) wherein the aforementioned dissolution accelerators are combined with conventional novolak resins constituted of cresol, xylenol and methoxyphenol and narrow in molecular weight distribution, thereby achieving the present invention.

Although reasons why special effects as described above can be produced are not yet clarified, the greatest contribution to those effects can be supposed to be made by a novolak resin which has a narrow molecular weight distribution and in which a monomer species represented by formula (I), or a monomer species having methyl or isopropyl groups at the 2- and 5-positions (with the proviso that an isopropyl group is present at least either of the two positions), is introduced. At any rate, the combination of the present novolak resin with definite amounts of photosensitive material and dissolution accelerator can have unexpected effects upon resolution, defocus latitude, development latitude and heat resistance, and these effects cannot be expected from individual effects of each constituent or additive effects of all constituents. Namely, this finding leads to the present invention.

DETAILED DESCRIPTION OF THE INVENTION

Now, embodiments of the present invention are illustrated in detail.

In the first place, desirable combinations of phenols for fully achieving the effects of the present invention are described below.

The present alkali-soluble novolak resin utilizes m-cresol as an essential constituent, and is obtained by the condensation reaction of phenols, which are constituted of m-cresol, a phenol compound of formula (I) and a phenol compound selected from those of formula (II) or (III), with an aldehyde.

It is required for m-cresol as a first phenol compound of the present novolak resin to comprise 50 to 90 mol % of the total monomer constituents. Preferably, the proportion of m-cresol to the total monomer constituents is from 50 to 70 mol %.

In a combination of phenols used in the present invention, when the proportion of m-cresol is lower than 50 mol %, sufficiently high sensitivity and heat resistance cannot be attained; whereas when the proportion of m-cresol is increased beyond 90 mol %, the resolution, the development latitude and the defocus latitude become insufficient.

The phenol compounds represented by the foregoing formula (I), which have methyl or isopropyl groups at the 2- and 5-positions, are second phenol compounds of the present novolak resin, are required to comprise 5 to 40 mol % of the total monomer constituents. Preferably, the proportion of those phenols to the total monomer constituents is from 10 to 35 mol %. When the proportion of the phenol compound of formula (I) is lower than 5 mol %, effects of the present invention, namely improvements in resolution, development latitude and defocus latitude, cannot be achieved sufficiently; whereas when the proportion of the phenol compound is increased beyond 40 mol %, the profile of the resist tends to be deteriorated.

A third phenol compound of the present novolak resin, namely a phenol compound selected from those represented by the foregoing formula (II) or (III), is used in a proportion of 0 to 40 mol %, preferably 3 to 35 mol %, to the total monomers. When the proportion of the third phenol compound represented by formula (II) or (III) is increased beyond 40 mol %, the sensitivity and the development latitude are deteriorated.

In addition to the aforementioned phenol compounds, other phenols as recited below can be used in such a proportion as not to impair the effects of the present invention, namely lower than 5 mol % to the total monomers. As examples of monomers which can be used additionally, mention may be made of o-cresol, o-methoxyphenol, m-methoxyphenol, o-ethylphenol, m-ethylphenol, p-ethylphenol, m-ethoxyphenol, 3,5-dimethoxyphenol, 2-methoxy-4-methylphenol, o-propoxyphenol, m-propoxyphenol, p-propoxyphenol, o-butoxyphenol, m-butoxyphenol, p-butoxyphenol, 3,4,5-trimethylphenol, 2,3,6-trimethylphenol, o-vinylphenol, m-vinylphenol, p-vinylphenol, o-allylphenol, m-allylphenol, p-allylphenol, o-phenylphenol, m-phenylphenol, p-phenylphenol, o-benzylphenol, m-benzylphenol, p-benzylphenol, o-methoxycarbonylphenol, m-methoxycarbonylphenol, p-methoxycarbonylphenol, o-benzoyloxyphenol, m-benzoyloxyphenol, p-benzoyloxyphenol, o-chlorophenol, m-chlorophenol, p-chlorophenol, o-cyclohexylphenol, p-cyclohexylphenol, 3-methyl-6-cyclohexylphenol, and polyhydroxybenzenes such as catechol, resorcinol, hydroquinone, phloroglucinol and pyrogallol.

The molecular weight distribution suitable for achieving the effects of the present invention is described below.

The novolak resin used in the present composition is required to have a relatively narrow distribution of molecular weights. The spread of a molecular weight distribution among polymer molecules is known to be generally expressed in terms of the ratio of a weight-average molecular weight (Mw) to a number-average molecular weight (Mn), or the Mw/Mn ratio (dispersion degree). The more widely molecular weights are distributed, the greater the numerical value of dispersion degree becomes. When polymer molecules have no distribution with respect to their weights, the ratio takes a value of 1. Novolak resins which have so far been used for typical positive working photoresist have relatively wide molecular weight distributions. As described representatively in JP-A-62-172341, many of those novolak resins have a dispersion degree of from 5 to 10. Further, *SPIE Proceeding* "Advances in Resist Technology and Processing V", vol. 920, p. 349, suggests that a novolak resin having a dispersion degree ranging from 4.55 to 6.75 provides a higher γ value than a novolak resin having a dispersion degree of 3.0.

In order that a novolak resin relating to the present invention achieves such an effect, by contrast with the foregoing suggestion, the dispersion degree is required to be in the range of 1.5 to 4.0, preferably 2.0 to 3.5. When the dispersion degree is too high, the effects intended by the present invention, including high resolution, wide defocus latitude and wide development latitude, cannot be accomplished. When the dispersion degree is too low, on the other hand, the synthesis of such novolak resins requires a high level of purification step, and so it is unsuitable from a practical point of view.

It is desirable for the present novolak resin to have a weight-average molecular weight (Mw) ranging from 2,000 to 20,000, preferably from 3,000 to 15,000. When the value of Mw is too great, similarly to the above, the effects which the present invention aims for, including high resolution, wide defocus latitude and wide development latitude, cannot be obtained.

At the production of novolak resins having such a low dispersion degree as that defined by the present invention, it can be thought of adopting various methods.

For instance, such resins can be obtained using the methods described in JP-A-60-189739, JP-A-60-140235, JP-A-64-14229, JP-A-1-105243, JP-A-2-60915, JP-A-4-122938, JP-A-4-101147, JP-A-4-251257, JP-A-4-296755, U.S. Pat. No. 4,795,829, U.S. Pat. No. 5,151,339 and so on, namely the method of selecting special phenolic monomers, the method of choosing a proper condition for the condensation reaction, the method of subjecting a conventional novolak resin, which is high in dispersion degree, to fractional precipitation, and so on. Any of these methods may be used for producing a novolak resin which can ensure the effects intended by the present invention.

The novolak resin used in the present invention is obtained by the polycondensation of the mixture of the aforementioned phenols with aldehydes.

Examples of aldehydes usable herein include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, vanillin, o-vanillin, iso-vanillin, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde and acetals thereof such as chloroacetaldehyde diethylacetal. Of these aldehydes, however, formaldehyde is preferred as a main aldehyde used in the present invention.

Those aldehydes may be used alone or as combination of two or more thereof.

As for the acid catalyst which can be used in the polycondensation, hydrochloric acid, sulfuric acid, formic acid, acetic acid, p-toluenesulfonic acid, methanesulfonic acid, malonic acid, mercaptoacetic acid and oxalic acid are examples thereof. These acids may also be used as a mixture of two or more thereof.

As for the photosensitive material used in the present invention, 1,2-naphthoquinonediazide-5-(and/or -4-) sulfonyl chloride esters of polyhydroxy compounds as recited below are examples thereof.

As examples of polyhydroxy compounds which can be used in the foregoing esterification, mention may be made of:

bis((poly)hydroxyphenyl)alkanes, such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1, nordihydroguaiaretic acid, and 1,1-bis(4-hydroxyphenyl)cyclohexane;

polyhydroxybenzoic acid esters, such as propyl 3,4,5-trihydroxybenzoate, phenyl 2,3,4-trihydroxybenzoate and phenyl 3,4,5-trihydroxybenzoate;

bis(polyhydroxybenzoyl)alkanes or bis(polyhydroxybenzoyl)arenes, such as bis(2,3,4-trihydroxybenzoyl)methane, bis(3-acetyl-4,5,6-trihydroxyphenyl)methane, bis(2,3,4-trihydroxybenzoyl)benzene and bis(2,4,6-trihydroxybenzoyl)benzene;

alkylene-di(polyhydroxybenzoate)'s, such as ethylene glycol di(3,5-dihydroxybenzoate) and ethylene glycol di(3,4,5-trihydroxybenzoate);

polyhydroxybiphenyls, such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2',4',6'-biphenylhexol and 2,3,4,2',3',4'-biphenylhexol;

bis(polyhydroxy)sulfides, such as 4,4'-thiobis(1,3-dihydroxy)benzene;

bis(polyhydroxyphenyl) ethers, such as 2,2',4,4'-tetrahydroxydiphenyl ether;

bis(polyhydroxyphenyl) sulfoxides, such as 2,2',4,4'-tetrahydroxydiphenyl sulfoxide;

bis(polyhydroxyphenyl)sulfones, such as 2,2',4,4'-diphenylsulfone;

polyhydroxytriphenylmethanes, such as tris(4-hydroxyphenyl)methane, 4,4',4''-trihydroxy-3,5,3',5'-tetramethyltriphenylmethane, 4,4',3'',4'-tetrahydroxy-3,5,3',5'-tetramethyltriphenylmethane, 4-[bis(3,5-dimethyl-4-hydroxyphenyl)methyl]-2-methoxyphenol, 4,4'-(3,4-diol-benzilidene)bis[2,6-dimethylphenol], 4,4'-[(2-hydroxyphenyl)methylene]bis[2-cyclohexyl-5-methylphenol], 4,4',2'',3'',4''-pentahydroxy-3,5,3',5'-tetramethyltriphenylmethane, 2,3,4,2',3',4'-hexahydroxy-5,5'-diacetyltriphenylmethane, 2,3,4,2',3',4',3'',4''-octahydroxy-5,5'-diacetyltriphenylmethane and 2,4,6,2',4',6'-hexahydroxy-5,5'-dipropionyltriphenylmethane;

polyhydroxytriphenylethanes, such as 4,4'-(phenylmethylene)bisphenol, 4,4'-(1-phenylethylidene)bis[2-methylphenol] and 4,4',4''-ethylidene-trisphenol;

polyhydroxyspirobi-indanes, such as 3,3,3',3'-tetramethyl-1,1'-spirobi-indane-5,6,5',6'-tetrol, 3,3,3',3'-tetramethyl-1,1'-spirobi-indane-5,6,7,5',6',7'-hexol, 3,3,3',3'-tetramethyl-1,1'-spirobi-indane-4,5,6,4',5',6'-hexol and 3,3,3',3'-tetramethyl-1,1'-spirobi-indane-4,5,6,5',6',7'-hexol;

polyhydroxyflavans, such as 2,4,4-trimethyl-2',4',7'-trihydroxyflavan;

polyhydroxyphthalides, such as 3,3-bis(3,4-dihydroxyphenyl)phthalide, 3,3-bis(2,3,4-trihydroxyphenyl)phthalide and 3',4',5',6'-tetrahydroxyspiro[phthalide-3,9'-xanthene];

flavonoid such as morin, quercetin and rutin;

the polyhydroxy compounds described in JP-A-04-253058, such as α,α',α''-tris(4-hydroxyphenyl) 1,3,5-triisopropylbenzene, α,α',α''-tris(3,5-dimethyl-4-hydroxyphenyl) 1,3,5-triisopropylbenzene, α,α',α''-tris(3,5-diethyl-4-hydroxyphenyl) 1,3,5-triisopropylbenzene, α,α',α''-tris(3,5-di-n-propyl-4-hydroxyphenyl) 1,3,5-triisopropylbenzene, α,α',α''-tris(3,5-diisopropyl-4-hydroxyphenyl) 1,3,5-triisopropylbenzene, α,α',α''-tris(3,5-di-n-butyl-4-hydroxyphenyl) 1,3,5-triisopropylbenzene, α,α',α''-tris(3-methyl-4-hydroxyphenyl) 1,3,5-triisopropylbenzene, α,α',α''-tris(3-methoxy-4-hydroxyphenyl) 1,3,5-triisopropylbenzene, α,α',α''-tris(2,4-dihydroxyphenyl) 1,3,5-triisopropylbenzene, 1,3, 5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl]benzene, 1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α',α'-bis(3"-methyl-4"-hydroxyphenyl)ethyl]benzene, 1-[α-methyl-α-(3'-methoxy-4'-hydroxyphenyl)ethyl]-4-[α',α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene and 1-[α-methyl-α-(2',4'-dihydroxyphenyl)ethyl]-3-[α',α'-bis(4"-hydroxyphenyl)ethyl]benzene;

the polyhydroxy compounds described in JP-A-5-224410, such as α,α,α',α',α",α"-hexakis-(4-hydroxyphenyl)-1,3,5-triethylbenzene; the poly(hydroxyphenyl)alkanes described in JP-A-5-303200 and European Patent 0,530,148, such as 1,2,2,3-tetra(p-hydroxyphenyl)propane and 1,3,3,5-tetra(p-hydroxyphenyl)pentane;

p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α-tris(2,3,4-trihydroxybenzoyl)mesitylene, 2,6-bis-(2-hydroxy-3,5-dimethylbenzyl)-p-cresol, 2,6-bis-(2-hydroxy-5'-methyl-benzyl)-p-cresol, 2,6-bis-(2,4,6-trihydroxybenzyl)-p-cresol, 2,6-bis-(2,3,4-trihydroxybenzyl)-p-cresol, 2,6-bis-(2,3,4-trihydroxybenzyl)-3,5-dimethylphenol, 4,6-bis-(4-hydroxy-3,5-dimethylbenzyl)-pyrogallol, 2,6-bis-(4-hydroxy-3,5-dimethylbenzyl)-1,3,4-trihydroxyphenol, 4,6-bis-(2,4,6-trihydoxybenzyl)-2,4-dimethylphenol, 4,6-bis-(2,3,4-trihydroxybenzyl)-2,5-dimethylphenol, 2,6-bis-(4-hydroxybenzyl)-p-cresol, 2,6-bis-(4-hydroxybenzyl)-4-cyclohexylphenol, 2,6-bis-(4-hydroxy-3-methylbenzyl)-p-cresol, 2,6-bis-(4-hydroxy-3,5-dimethylbenzyl)-p-cresol, 2,6-bis-(4-hydroxy-2,5-dimethylbenzyl)-p-cresol, 2,6-bis-(4-hydroxy-3-methylbenzyl)-4-phenylphenol, 2,2',6,6'-tetrakis[(4-hydroxyphenyl)methyl]-4,4'-methylenediphenol, 2,2',6,6'-tetrakis[(4-hydroxy-3-dimethylphenyl)methyl]-4,4'-methylenediphenol, 2,2',6,6'-tetrakis[(4-hydroxy-3-methylphenyl)methyl]-4,4'-methylenediphenol, and 2,2'-bis[(4-hydroxy-3,5-dimethylphenyl)methyl]-6,6'-dimethyl-4,4'-methylenediphenol.

In addition, novolak resins, polyhydroxystyrene resins, acetone-pyrogallol resins and the like can be used.

The esterification reaction for the photosensitive material described hereinbefore is achieved by dissolving prescribed amounts of polyhydroxy compound and 1,2-naphthoquinonediazide-5-(and/or -4-)sulfonyl chloride in a solvent, such as dioxane, acetone, tetrahydrofuran, methyl ethyl ketone, N-methylpyrrolidone, chloroform, trichloroethane, trichloroethylene or dichloroethane, and conducting condensation therein by adding dropwise thereto a basic catalyst, such as sodium hydroxide, sodium carbonate, sodium hydrogen carbonate, triethylamine, N-methylmorpholine, N-methylpiperazine or 4-dimethylaminopyridine. The thus obtained product is washed with water, purified, and then dried.

In a general esterification reaction, the product obtained is a mixture of esterified compounds differing in esterification number and esterified site. However, it is also possible to selectively esterify some particular isomer alone by choosing the reaction condition and the structure of a polyhydroxy compound to be esterified. The term "esterification rate" as used in the present invention refers to the average of esterification rates of the aforesaid mixture.

The esterification rate as defined above can be controlled by properly choosing the ratio between starting materials to be mixed, namely a polyhydroxy compound and 1,2-naphthoquinonediazide-5-(and/or -4-)sulfonyl chloride. More specifically, since substantially all the 1,2-naphthoquinonediazide-5-(and/or -4-)sulfonyl chloride added undergoes the esterification reaction, a mixture having a desired esterification rate can be obtained by adjusting the molar ratio between the starting materials.

The esterification rate appropriate for the present invention is from 30 to 90%, preferably from 40 to 80%. When the esterification degree is less than 30%, the resolution, the defocus latitude and the profile are deteriorated; while when it is more than 90%, the sensitivity is lowered. 1,2-Naphthoquinonediazide-5-sulfonyl chloride and 1,2-naphthoquinonediazide-4-sulfonyl chloride may be used together, if desired.

The reaction temperature in the foregoing method is generally from −20° C. to 60° C., and preferably from 0 to 40° C.

The photosensitive compounds produced in the manner as described above are used as a resinous composition. Therein, they may be used individually or as a mixture of two or more thereof, and the alkali-soluble resin is mixed therewith. The amount of photosensitive compound(s) mixed is in excess of 30 parts by weight, and that less than 100 parts by weight, per 100 parts by weight of novolak resin. Preferably, the amount mixed is from 35 to 90 parts by weight. When the proportion of the compound(s) mixed is not more than 30 parts by weight, improvements in sensitivity, resolution, defocus latitude and development latitude, that is, the effects of the present invention, cannot be attained satisfactorily; while when it is increased beyond 100 parts by weight, the sensitivity and the profile are deteriorated.

The low molecular weight compound having phenolic hydroxy groups, which constitutes the present invention, includes the compounds in which the number of total carbon atoms per molecule is from 12 to 50 and the number of total phenolic hydroxy groups per molecule is from 2 to 8. Of such compounds, those which, when added to the present novolak resin, can increase the dissolution speed of the novolak resin in alkali are preferred in particular. When the number of total carbon atoms in the aforesaid low molecular weight compound is not smaller than 51, the effects of the present invention are considerably lessened. On the other hand, the compounds containing at most 11 carbon atoms per molecule bring about a new defect of lowering the heat resistance and so on. In order to achieve the effects of the present invention, it is required for the low molecular weight compound to have at least two hydroxyl groups. However, the presence of 9 or more hydroxyl groups therein spoils the effect of improving on the resolution, the defocus latitude and the development latitude.

It is desirable that those low molecular weight compounds be added in a proportion exceeding 20 parts by weight, and that below 60 parts by weight, preferably from 30 to 55 parts by weight, to 100 parts by weight of the novolak resin. Although the present inventors were previously proposed the positive working photoresist composition in which 30 parts by weight of a low molecular weight phenol compound was admixed with a novolak resin having a dispersion degree of from 1.5 to 4.0 (JP-A-4-122938), the addition of a low molecular weight phenol compound as dissolution accelerator in an amount exceeding 30 parts by weight had a defect of causing pattern deformation upon development when the compound was used in combination with the novolak resin as disclosed therein. On the contrary, to our surprise, it has been found that in the combination with the present novolak resin the addition of such a compound in an amount exceeding 20 parts by weight was rather efficient for fully achieving the present effects, and that free from the defect of causing pattern deformation.

In other words, the addition in an amount of not more than 20 parts by weight is insufficient for bringing about the effects intended by the present invention, while the addition in an amount beyond 60 parts by weight causes a problem of lowering the heat resistance.

As for the low molecular weight compound used in the present invention, any compounds can bring about the intended effects so far as they can satisfy the aforementioned structural requirements.

Suitable examples of a polyhydroxy compound as described above include phenols, resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucidol, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl) hexane, 1,1,2,2-tetrakis(4-hydroxyphenyl)ethane, 1,1,3-tris(hydroxyphenyl)butane and para[α,α,α',α'-tetrakis(4-hydroxyphenyl)]xylene. In addition, polyhydroxy compounds functioning as intermediary materials of the aforementioned photosensitive material (skeleton) can also be employed.

Examples of a solvent which can be used for dissolving the present alkali-soluble novolak resin, photosensitive material and dissolution accelerator include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, propylene glycol monomethyl ether propionate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl β-methoxyisobutyrate, methyl α-hydroxyisobutyrate, methyl pyruvate, ethyl pyruvate, ethyl acetate, and butyl acetate. These organic solvents are used alone or as a mixture of two or more thereof.

Also, such an organic solvent as cited above can be used as a mixture with a high boiling point solvent, such as N-methylformamide, N,N-dimethylformamide, N-methylacetamide, N,N-dimethylacetamide, N-methylpyrrolidone, dimethyl sulfoxide and benzyl ethyl ether.

Into the positive working photoresist composition of the present invention, a surfactant can be blended in order to improve upon coating properties, such as striation.

As examples of a surfactant which can be used for the aforesaid purpose, mention may be made of nonionic surfactants including polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylenesorbitan fatty acid esters, such as polyoxyethylenesorbitan monolaurate, polyoxyethylenesorbitan monopalmitate, polyoxyethylenesorbitan monostearate, polyoxyethylenesorbitan trioleate and polyoxyethylenesorbitan tristearate: fluorine-containing surfactants, such as Eftop EF 301, EF303 and EF352 (trade names, products of Shin Akita Kasei Co., Ltd.), Megafac F171 and F173 (trade names, products of Dainippon Ink & Chemicals, Inc.), Florad FC430 and FC431 (trade names, products of Sumitomo 3M), and Asahi Guard AG710, Surflon S-382, SC101, SC102, SC103, SC104, SC105 and SC106 (trade names, products of Asahi Glass Company Ltd.): organosiloxane polymers, such as KP341 (code name, a product of Shin-Etsu Chemical Industry Co., Ltd.): and acrylic acid or methacrylic acid (co)polymers, such as Polyflow No. 75 and No. 95 (trade name, products of Kyoeisha Yushi Kagaku Kogyo K.K.). Such a surfactant as cited above is generally blended in a proportion of no greater than 2 parts by weight, preferably no greater than 1 part by weight, to 100 parts by weight of the total of alkali-soluble resin(s) and quinonediazide compound(s) in the present composition.

Those surfactants may be added alone or as a mixture of some of them.

Developing solutions which can be used for the positive working photoresist composition of the present invention are water solutions of alkalis, including inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide and choline, and cyclic amines such as pyrrole and piperidine. Also, the water solutions of those alkalis can be admixed with appropriate amounts of an alcohol, such as isopropyl alcohol, and a surfactant of, e.g., nonionic type.

In the positive working photoresist composition of the present invention, a light absorbent, a cross-linking agent, an adhesion assistant and so on can be blended, if needed. The light absorbent is added for the purpose of inhibiting halation from a substrate or enhancing visibility when the photoresist composition is coated on a transparent support, if needed. Suitable examples of such a light absorbent include commercially available ones as described, e.g., in *Kogyo-yo Shikiso no Gijutsu to Shijo* (which means "Arts and Market of Industrial Dyes") published by CMC Shuppan and *Senryo Binran* (which means "Handbook of Dyes) compiled by Yuki Gosei Kagaku Kyokai, such as C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 165, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10, and C.I. Pigment Brown 2. The light absorbent as cited above is generally blended in a proportion of no greater than 100 parts by weight, preferably no greater than 50 parts by weight, and more preferably no greater than 30 parts by weight, to 100 parts by weight of alkali-soluble resin(s).

So far as it has no significant influence for the formation of positive images, a cross-linking agent is added. The addition of a cross-linking agent is intended mainly for adjustment of sensitivity and improvements in heat resistance and dry etching resistance.

As examples of a cross-linking agent which can be used, mention may be made of compounds obtained by acting formaldehyde on melamine, benzoguanamine, glycoluril and the like, alkyl-modified compounds thereof, epoxy compounds, aldehydes, azide compounds, organic peroxides, and hexamethylenetetramine. These cross-linking agents can be blended in a proportion of less than 10 parts by weight, preferably less than 5 parts by weight, to 100 parts by weight of a light-sensitive agent. When the amount of a cross-linking agent blended is increased beyond 10 parts by weight, undesirable things including a drop in sensitivity and generation of scum (resist residue) are caused.

An adhesion assistant is added for the purpose of heightening the adhesiveness of the resist to a substrate, thereby preventing the resist from peeling off, particularly in an etching step. Specific examples thereof include chlorosilanes, such as trimethylchlorosilane, dimethylvinylchlorosilane, methyldiphenylchlorosilane and chloromethyldimethylchlorosilane; alkoxysilanes, such as trimethylmethoxysilane, dimethyldiethoxysilane, methyldimethoxysilane, dimethylvinylethoxysilane, diphenyldimethoxysilane and phenyltriethoxysilane; silazanes, such as hexamethyldisilazane, N,N'-bis(trimethylsilyl)urea, dimethyltrimethylsilylamine and trimethylsilylimidazole; silanes, such as vinyltrichlorosilane, γ-chloropropyltrimethoxysilane, γ-aminopropyltriethoxysilane and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine; and urea compounds, such as 1,1-dimethylurea and 1,3-dimethylurea, or thiourea compounds.

These adhesion assistants are blended in a proportion of generally less than 10 parts by weight, preferably less than 5 parts by weight, to 100 parts by weight of alkali-soluble resin(s).

The positive working photoresist composition as mentioned above is coated on a substrate suitable for production of precision integrated circuit elements (e.g., a transparent substrate such as silicon/silicon dioxide-coated, glass substrate and ITO substrate) by an appropriate coating method, such as a spin coating method, a roll coating method, a flow coating method, a dip coating method, a spray coating method, or a doctor coating method. The thus coated composition is subjected successively to prebake, exposure to light via a desired mask, PEB (PEB: Post Exposure Bake) if needed, development, rinsing and drying to provide a satisfactory resist.

EXAMPLES

Synthesis Example 1
Synthesis of Novolak Resin A (present resin):

| m-Cresol | 70 g |
|---|---|
| 2-Methyl-5-isopropylphenol | 41.3 g |

The above ingredients, 53 g of a 37% water solution of formaldehyde and 0.15 g of oxalic acid were placed in a three-necked flask, and heated to 100° C. with stirring to undergo the reaction for 14 hours.

Then, the reaction system was heated up to 200° C. and evacuated gradually to a pressure of 1 mmHg, whereby the water, the monomers and formaldehyde remaining reacted and the oxalic acid were distilled away.

The molten residue was cooled to room temperature, and thereby a novolak resin was recovered. The thus obtained novolak resin (a) had a weight-average molecular weight of 4250 (reduced to a polystyrene basis).

Further, a 20 g portion of this novolak resin (a) was dissolved completely in 60 g of methanol, and thereto was gradually added 30 g of water with stirring; as a result, the resin component was precipitated. The upper layer was removed by decantation, while the precipitated resin fraction was recovered. The recovered matter was heated to 40° C. and dried for 24 hours under a reduced pressure to give an alkali-soluble Novolak Resin A. The thus obtained Novolak Resin A had a weight-average molecular weight of 10,100 (reduced to a polystyrene basis) and a dispersion degree of 3.2. In addition, the monomer, dimer and trimer contents therein were found to be 0%, 2.6% and 3.6% respectively. This result indicates that 56% of the low molecular weight component was removed by the fractional reprecipitation operation.

Synthesis Example 2
Synthesis of Novolak Resin B (present resin):

| m-Cresol | 70 g |
|---|---|
| 2-Methyl-5-isopropylphenol | 34.8 g |
| 2,3-Xylenol | 6 g |

The above ingredients, 56 g of a 37% water solution of formaldehyde and 0.16 g of oxalic acid were placed in a three-necked flask, and heated to 100° C. with stirring to undergo the reaction for 16 hours.

Then, the reaction system was heated up to 200° C. and evacuated gradually to a pressure of 1 mmHg, whereby the water, the monomers and formaldehyde remaining unreacted and the oxalic acid were distilled away.

The molten residue was cooled to room temperature, and thereby a novolak resin was recovered. The thus obtained novolak resin (b) had a weight-average molecular weight of 3420 (reduced to a polystyrene basis). Further, a 20 g portion of this novolak resin (b) was dissolved completely in 60 g of acetone, and thereto was gradually added 60 g of hexane with stirring, and further the resulting solution was allowed to stand for 2 hours. The upper layer was removed by decantation, while the precipitated resin fraction was recovered. The recovered matter was heated to 40° C. and dried for 24 hours under a reduced pressure to give an alkali-soluble Novolak Resin B. The thus obtained Novolak Resin B had a weight-average molecular weight of 9,090 (reduced to a polystyrene basis) and a dispersion degree of 2.9. In addition, the monomer, dimer and trimer contents therein were found to be 0%, 2.4% and 2.4% respectively. This result indicates that 64% of the low molecular weight component was removed by the fractional reprecipitation operation.

Synthesis Examples 3 to 13

Syntheses of Novolak Resins C to M (present resins):

Novolak resins (c) to (m) were each synthesized in the same manner as in the aforementioned Synthesis Example 2, except that the monomer species and their respective amounts (mol %) used for the condensation reaction with formaldehyde were changed to those set forth in Table 1.

A 20 g portion of each of the novolak resins (c) to (m) was dissolved in 80 g of acetone, and thereto was gradually added 80 g of hexane with stirring, and further the resulting solution was allowed to stand for 2 hours. The upper layer was removed by decantation, while the precipitated resin fraction was recovered. The recovered matter was heated to 40° C. and dried for 24 hours under a reduced pressure. Thus, Novolak Resins C to M were obtained. Each of Novolak Resins C to M isolated by the fractionation was examined for the proportion (%) of the low molecular weight component removed by fractionation, Mw, Mw/Mn, the monomer content, the dimer content and the trimer content, and the results thereof are shown in Table 2.

Comparative Synthesis Example 1

Synthesis of Novolak Resin (n) [comparative resin]:

| m-Cresol | 43 g |
| p-Cresol | 57 g |

The above ingredients, 49 g of a 37% water solution of formaldehyde and 0.13 g of oxalic acid were placed in a three-necked flask, and heated to 100° C. with stirring to undergo the reaction for 16 hours.

Then, the reaction system was heated up to 200° C., and evacuated gradually to a pressure of 5 mmHg to remove the water, the monomers and formaldehyde remaining unreacted and the oxalic acid. The molten residue was cooled to room temperature, and thereby an alkali-soluble novolak resin was recovered. The thus obtained novolak resin (n) had a weight-average molecular weight of 7,810 (reduced to a polystyrene basis) and a dispersion degree of 6.20. In addition, the monomer, dimer and trimer contents therein were found to be 0.2%, 13.1% and 7.2% respectively.

Comparative Synthesis Example 2

Synthesis of Novolak Resin (o) [comparative resin]:

| m-Cresol | 50 g |
| p-Cresol | 25 g |
| 2,5-Xylenol | 28 g |

The above ingredients, 53 g of a 37% water solution of formaldehyde and 0.15 g of oxalic acid were placed in a three-necked flask, and heated to 100° C. with stirring to undergo the reaction for 14 hours.

Then, the reaction system was heated up to 200° C. and evacuated gradually to a pressure of 1 mmHg, whereby the water, the monomers and formaldehyde remaining unreacted and the oxalic acid were distilled away. The molten residue was cooled to room temperature, and thereby an alkali-soluble novolak resin was recovered. The thus obtained novolak resin (o) had a weight-average molecular weight of 4820 (reduced to a polystyrene basis) and a dispersion degree of 5.7. In addition, the monomer, dimer and trimer contents therein were found to be 0.1%, 14.0% and 6.9% respectively.

Comparative Synthesis Examples 3 and 4

Syntheses of Novolak Resins (p) and (q) [comparative resins]:

Novolak resins (p) and (q) were each synthesized in the same manner as in the aforementioned Comparative Synthesis Example 2, except that the monomer species and their respective amounts (mol %) used for the condensation reaction with formaldehyde were changed to those set forth in Table 3. The weight-average molecular weights (reduced to a polystyrene basis) of the thus obtained Novolak Resins (p) and (q) are set forth in Table 3.

Comparative Synthesis Example 5

Synthesis of Novolak Resin R [comparative resin]:

| m-Cresol | 60 g |
| p-Cresol | 40 g |

The above ingredients, 56 g of a 37% water solution of formaldehyde and 0.16 g of oxalic acid were placed in a three-necked flask, and heated to 100° C. with stirring to undergo the reaction for 16 hours.

Then, the reaction system was heated up to 200° C. and evacuated gradually to a pressure of 1 mmHg, whereby the water, the monomers and formaldehyde remaining unreacted and the oxalic acid were distilled away.

The molten residue was cooled to room temperature, and thereby a novolak resin was recovered. The thus obtained novolak resin (r) had a weight-average molecular weight of 4,310 (reduced to a polystyrene basis). Further, a 20 g portion of this novolak resin (r) was dissolved completely in 60 g of acetone, and thereto was gradually added 60 g of hexane with stirring, and further the resulting solution was allowed to stand for 2 hours. The upper layer was removed by decantation, while the precipitated resin fraction was recovered. The recovered matter was heated to 40° C. and dried for 24 hours under a reduced pressure to give an alkali-soluble Novolak Resin R. The thus obtained Novolak Resin R had a weight-average molecular weight of 8,910 (reduced to a polystyrene basis) and a dispersion degree of 3.4. In addition, the monomer, dimer and trimer contents therein were found to be 0%, 2.9% and 3.8% respectively. This result indicates that 61% of the low molecular weight component was removed by the fractional reprecipitation operation.

Comparative Synthesis Example 6
Synthesis of Novolak Resin S [comparative resin]:

| m-Cresol | 50 g |
|---|---|
| p-Cresol | 25 g |
| 2,5-Xylenol | 28 g |

The above ingredients, 53 g of a 37% water solution of formaldehyde and 0.15 g of oxalic acid were placed in a three-necked flask, and heated to 100° C. with stirring to undergo the reaction for 14 hours.

Then, the reaction system was heated up to 200° C. and evacuated gradually to a pressure of 1 mmHg, whereby the water, the monomers and formaldehyde remaining unreacted and the oxalic acid were distilled away. The molten residue was cooled to room temperature, and thereby a novolak resin was recovered. The thus obtained novolak resin (s) had a weight-average molecular weight of 4,700 (reduced to a polystyrene basis). Further, a 20 g portion of this novolak resin (s) was dissolved completely in 60 g of methanol, and thereto was gradually added 30 g of water with stirring; as a result, the resin component was precipitated. The upper layer was removed by decantation, while the precipitated resin fraction was recovered. The recovered matter was heated to 40° C. and dried for 24 hours under a reduced pressure to give an alkali-soluble Novolak Resin S. The thus obtained Novolak Resin S had a weight-average molecular weight of 9,920 (reduced to a polystyrene basis) and a dispersion degree of 3.5. In addition, the monomer, dimer and trimer contents therein were found to be 0%, 2.5% and 3.7% respectively. This result indicates that 54% of the low molecular weight component was removed by the fractional reprecipitation operation.

Comparative Synthesis Examples 7 to 11
Syntheses of Novolak Resins T to X [comparative resins]:

Novolak resins (t) to (x) were each synthesized in the same manner as in the aforementioned Comparative Synthesis Example 2, except that the monomer species and their respective amounts (mol %) used for the condensation reaction with formaldehyde were changed to those set forth in Table 3. Then, a 20 g portion of each of the novolak resins (t) to (x) was dissolved in 80 g of acetone, and thereto was gradually added 80 g of hexane with stirring, and further the resulting solution was allowed to stand for 2 hours. The upper layer was removed by decantation, while the precipitated resin fraction was recovered. The recovered matter was heated to 40° C. and dried for 24 hours under a reduced pressure. Thus, alkali-soluble Novolak Resins T to X were obtained. Each of Novolak Resins T to X isolated by the fractionation was examined for the proportion (%) of the low molecular weight component removed by fractionation, Mw, Mw/Mn, the monomer content, the dimer content and the trimer content, and the results thereof are shown in Table 4.

TABLE 1

Syntheses of Novolak Resins (a) to (m)

| Novolak Resin | Monomer Composition | (Amounts charged, by mol %) | Mw |
|---|---|---|---|
| (a) | m-cresol/A | (70/30) | 4250 |
| (b) | m-cresol/A/2,3-xylenol | (70/25/5) | 3420 |
| (c) | m-cresol/A/3,5-xylenol | (65/20/15) | 3690 |
| (d) | m-cresol/A/2,3,5-trimethylphenol | (75/15/10) | 3240 |
| (e) | m-cresol/A/p-cresol | (60/35/5) | 4050 |
| (f) | m-cresol/A/p-methoxyphenol | (70/15/15) | 3550 |
| (g) | m-cresol/A/2,6-bishydroxymethyl-p-cresol | (50/20/30) | 2470 |
| (h) | m-cresol/B/3,4-xylenol | (55/40/5) | 3360 |
| (i) | m-cresol/B/2,3-xylenol | (60/25/15) | 3310 |
| (j) | m-cresol/B/2,5-xylenol | (70/20/10) | 3140 |
| (k) | m-cresol/B/3,5-xylenol | (65/20/15) | 3060 |
| (l) | m-cresol/A/2,3-xylenol/p-cresol | (65/15/10/10) | 3000 |
| (m) | m-cresol/A/3,5-xylenol/2,6-bishydroxymethyl-p-cresol | (70/20/10/10) | 2700 |

A: 2-methyl-5-isopropylphenol (isothymol)
B: 5-methyl-2-isopropylphenol (thymol)

TABLE 2

Syntheses of Present Novolak Resins

| Novolak Resin | Proportion of Low Molecular Weight Component Removed | Mw | Mw/Mn | Contents of Lower Polymers in Novolak |  |  |
|---|---|---|---|---|---|---|
| | | | | monomer | dimer | trimer |
| A | 56% | 10100 | 3.2 | 0% | 2.6% | 3.6% |
| B | 64% | 9090 | 2.9 | 0% | 2.4% | 2.4% |
| C | 58% | 8700 | 3.3 | 0.1% | 2.0% | 2.3% |
| D | 54% | 7800 | 3.4 | 0% | 2.3% | 2.4% |
| E | 50% | 9400 | 2.8 | 0.1% | 2.3% | 2.1% |
| F | 54% | 8160 | 3.6 | 0.1% | 2.3% | 2.0% |
| G | 55% | 6190 | 2.9 | 0% | 1.4% | 1.6% |
| H | 51% | 6290 | 2.6 | 0.1% | 1.3% | 2.6% |
| I | 57% | 6000 | 3.1 | 0% | 2.0% | 2.2% |

TABLE 2-continued

Syntheses of Present Novolak Resins

| Novolak Resin | Proportion of Low Molecular Weight Component Removed | Mw | Mw/Mn | Contents of Lower Polymers in Novolak | | |
|---|---|---|---|---|---|---|
| | | | | monomer | dimer | trimer |
| J | 42% | 6760 | 3.6 | 0.1% | 3.0% | 3.2% |
| K | 41% | 5600 | 3.7 | 0.2% | 2.4% | 3.7% |
| L | 56% | 8100 | 3.4 | 0% | 2.6% | 3.6% |
| M | 74% | 6090 | 2.5 | 0% | 1.3% | 1.8% |

TABLE 3

Syntheses of Comparative Novolak Resins (n) to (x)

| Novolak Resin | Monomer Composition | (Amounts charged, by mol %) | Mw |
|---|---|---|---|
| (n) | m-cresol/p-cresol | (40/60) | 7810 |
| (o) | m-cresol/p-cresol/2,5-xylenol | (50/25/25) | 4820 |
| (p) | m-cresol/p-cresol/2,3-xylenol | (40/40/20) | 4510 |
| (q) | m-cresol/3,5-xylenol | (50/50) | 4220 |
| (r) | m-cresol/p-cresol | (60/40) | 4310 |
| (s) | m-cresol/p-cresol/2,3-xylenol | (50/25/25) | 4720 |
| (t) | m-cresol/p-cresol/p-methoxyphenol | (40/40/20) | 2890 |
| (u) | m-cresol/o-ethylphenol/p-cresol | (30/30/40) | 3280 |
| (v) | m-cresol/A/p-cresol | (20/30/50) | 3200 |
| (w) | m-cresol/A/3,5-xylenol | (40/10/50) | 4180 |
| (x) | m-cresol/A/3,4-xylenol | (30/20/50) | 2600 |

A: 2-methyl-5-isopropylphenol (isothymol)

TABLE 4

Syntheses of Comparative Novolak Resins R to X

| Novolak Resin | Proportion of Low Molecular Weight Component Removed | Mw | Mw/Mn | Contents of Lower Polymers in Novolak | | |
|---|---|---|---|---|---|---|
| | | | | monomer | dimer | trimer |
| R | 61% | 8910 | 3.4 | 0% | 2.9% | 3.8% |
| S | 54% | 9920 | 3.5 | 0% | 2.5% | 3.7% |
| T | 72% | 7760 | 2.9 | 0.2% | 3.1% | 3.4% |
| U | 60% | 7600 | 3.0 | 0.2% | 3.1% | 3.7% |
| V | 62% | 7420 | 3.1 | 0.2% | 2.8% | 3.6% |
| W | 46% | 7400 | 3.4 | 0% | 2.7% | 3.1% |
| X | 49% | 4150 | 3.2 | 0.2% | 4.5% | 6.1% |

Synthesis Example 14

Synthesis of Photosensitive Material A:

In a three-necked flask, 12.3 g of 2,3,4,4'-tetrahydroxybenzophenone, 40.3 g of 1,2-naphthoquinonediazide-5-sulfonyl chloride and 300 ml of acetone were placed, and mixed homogeneously to make a solution. Then, a mixture of 15.2 g of triethylamine with 50 ml of acetone was slowly dropped into the solution, and therein the reaction was run for 3 hours at 25° C. The reaction mixture thus obtained was poured into 1,500 ml of a 1% water solution of hydrogen chloride to precipitate the intended product. The precipitated product was filtered off, washed with water and dried (at 40° C.). Thus, 39.7 g of 1,2-naphthoquinonediazide-5-sulfonic acid ester of 2,3,4,4'-tetrahydroxybenzophenone (Photosensitive Material A) was obtained.

Synthesis Example 15

Synthesis of Photosensitive Material B:

In a three-necked flask, 10 g of 3,3,3',3'-tetramethyl-1,1'-spirobi-indane-5,6,7,5',6',7'-hexol, 32.0 g of 1,2-naphthoquinonediazide-5-sulfonyl chloride and 500 ml of acetone were placed, and mixed homogeneously to make a solution. Then, a mixture of 13.7 g of triethylamine with 50 ml of acetone was slowly dropped into the solution, and therein the reaction was run for 3 hours at 25° C. The reaction mixture thus obtained was poured into 1,500 ml of a 1% water solution of hydrogen chloride to precipitate the intended product. The precipitated product was filtered off, washed with successive water and methanol, and then dried (at 40° C.). Thus, 27.8 g of 1,2-naphthoquinonediazide-5-sulfonic acid ester of 3,3,3'. 3'-tetramethyl-1,1'-spirobi-indane-5,6,7,5',6',7'-hexol (Photosensitive Material B) was recovered. The recovered matter was analyzed by HPLC, and thereby found to be constituted of 83% of the hexaesterified compound and the residual % of other lower-grade substitution products.

Synthesis Example 16

Synthesis of Photosensitive Material C:

In a three-necked flask, 35.3 g of α,α',α"-tris(4-hydroxyphenyl)-1-ethyl-4-isopropylbenzene, 53.7 g of 1,2-naphthoquinonediazide-5-sulfonyl chloride and 800 ml of acetone were placed, and mixed homogeneously to make a solution. Then, 21.2 g of triethylamine was slowly dropped into the solution, and therein the reaction was run for 3 hours at 25° C. The reaction mixture thus obtained was poured into 3,000 ml of a 1% water solution of hydrogen chloride to precipitate the intended product. The precipitated product was filtered off, washed with water and dried. Thus, 75.0 g of 1,2-naphthoquinonediazide-5-sulfonic acid ester of α,α', α"-tris(4-hydroxyphenyl)-1-ethyl-4-isopropylbenzene (Photosensitive Material C) was obtained.

Synthesis Example 17

Synthesis of Photosensitive Material D:

In a three-necked flask, 37.6 g of 2,6-bis(4-hydroxy-2,5-dimethylbenzyl)-p-cresol, 53.7 g of 1,2-naphthoquinonediazide-5-sulfonyl chloride and 750 ml of acetone were placed, and mixed homogeneously to make a solution. Then, 21.2 g of triethylamine was slowly dropped into the solution, and therein the reaction was run for 3 hours at 25° C. The reaction mixture thus obtained was poured into 2,500 ml of a 1% water solution of hydrogen chloride to precipitate the intended product. The precipitated product was filtered off, washed with water and dried (at 40° C.). Thus, 72.1 g of 1,2-naphthoquinonediazide-5-sulfonic acid ester of 2,6-bis(4-hydroxy-2,5-dimethylbenzyl)-p-cresol (Photosensitive Material D) was obtained.

Synthesis Example 18

Synthesis of Photosensitive Material E:

In a three-necked flask, 39.3 g of 4,4',4"-trihydroxy-3,5,3',5'-tetramethyltriphenylmethane, 53.7 g of 1,2-naphthoquinonediazide-5-sulfonyl chloride and 750 ml of chloroform were placed, and mixed homogeneously to make a solution. Then, 21.2 g of triethylamine was slowly dropped into the solution, and therein the reaction was run for 3 hours at 25° C. The reaction mixture thus obtained was concentrated, and dissolved again in acetone. The resulting solution was poured into 2,500 ml of a 1% water solution of hydrogen chloride to precipitate the intended product. The precipitated product was filtered off, washed with water and dried (at 40° C.). Thus, 72.1 g of 1,2-naphthoquinonediazide-5-sulfonic acid ester of 4,4',4"-trihydroxy-3,5,3',5'-tetramethyltriphenylmethane (Photosensitive Material E) was obtained.

Synthesis Example 19

Synthesis of Photosensitive Material F:

In a four-necked flask equipped with a stirrer, a reflux condenser, a thermometer and a dropping means, 107.1 g of 3,3'-dimethyl-4,4'-dihydroxybiphenyl, 455.8 g of a 25% water solution of TMAH (tetramethylammonium hydroxide) and 500 ml of distilled water were placed, and heated to 40° C. to dissolve 3,3'-dimethyl-4,4'-dihydroxybiphenyl. Thereinto, 243.5 g of a 37% of water solution of formaldehyde was dropped over a period of 30 minutes, and heated for 12 hours at 40° C. with stirring. The reaction mixture was admixed with 500 ml of distilled water and 125 ml of hydrochloric acid to yield a brown solid. The brown solid was purified by column chromatography to give 95.9 g of a white powder identified as Compound (a) illustrated below.

A 82.2 g portion of the thus obtained Compound (a), 282.3 g of phenol and 1,000 ml of methanol were placed in a three-necked flask equipped with a stirrer, a reflux condenser and a thermometer, and heated at 60° C. to dissolve the Compound (a). At the conclusion of the dissolution of the Compound (a), 3 g of concentrated sulfuric acid was added thereto, and heated with stirring under reflux for 5 hours. The reaction mixture thus obtained was admixed with 10 l of distilled water to liberate the product as a yellow precipitate. The yellow precipitate separated by filtration was purified by column chromatography, and thereby 63.9 g of a white powder identified as the following Compound (b) was obtained.

In a three-necked flask, a 39.8 g portion of the Compound (b) obtained above, 73.9 g of 1,2-naphthoquinonediazide-5-sulfonyl chloride and 750 ml of chloroform were placed, and mixed homogeneously to make a solution. Then, 30.6 g of triethylamine was slowly dropped into the solution, and therein the reaction was run for 4 hours at 25° C. The reaction mixture thus obtained was concentrated, and dissolved again in acetone. The resulting solution was poured into 3,000 ml of a 1% water solution of hydrogen chloride to precipitate the intended product. The precipitated product was filtered off, washed with water and dried (at 40° C.). Thus, 79.5 g of Photosensitive Material F was obtained.

Compound (a)

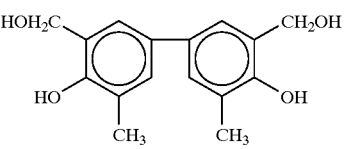

Compound (b)

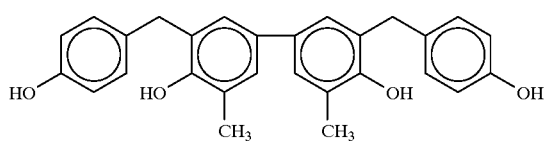

Synthesis Example 20

Synthesis of Photosensitive Material G:

In a four-necked flask equipped with a stirrer, a reflux condenser, a thermometer and a dropping means, 1141.7 g of 2-cyclohexyl-5-methylphenol, 60.0 g of sodium hydroxide and 300 g of distilled water were placed, and stirred. At the time when 2-cyclohexyl-5-methylphenol was completely dissolved, the resulting solution was heated up to 50° C. Thereto, a 37% water solution of formaldehyde was added dropwise over a period of 3 hours. Further, the heating with stirring was continued for 6 hours. After the completion of the reaction, the reaction product was cooled to room temperature, and neutralized with concentrated hydrochloric acid to separate out as a brown solid. The brown solid was filtered off, dissolved thoroughly in a 25% water solution of tetramethylammonium hydroxide, and then neutralized with a 5% water solution of ammonium hydrogen carbonate. Thus, a light brown powder was separated out, and underwent filtration. The powder thus obtained was washed with successive distilled water, diluted hydrochloric acid and distilled water to give 409.2 g of Compound (c) illustrated below.

In the same reaction apparatus as described above, 227.3 g of the Compound (c) obtained above, 941.1 g of phenol and 1,000 ml of methanol were placed, and heated at 40° C. with stirring to completely dissolve the Compound (c) and phenol. At the conclusion of the dissolution, 5 g of concentrated sulfuric acid was added dropwise to the solution over a 10-minute period, and heated with stirring under reflux for 6 hours. The reaction mixture thus obtained was admixed with 10 l of distilled water to deposit a brown precipitate. The brown precipitate separated by filtration was purified by column chromatography, and thereby 150.0 g of the following Compound (d) was obtained.

In a three-necked flask, 57.6 g of Compound (d) obtained above, 53.7 g of 1,2-naphthoquinonediazide-5-sulfonyl chloride and 750 ml of chloroform were placed, and mixed homogeneously to make a solution. Then, 22.3 g of triethylamine was slowly dropped into the solution, and therein the reaction was run for 4 hours at 25° C. The reaction mixture thus obtained was concentrated, and dissolved again in acetone. The resulting solution was poured into 3,000 ml of a 1% water solution of hydrogen chloride to precipitate the intended product. The precipitated product was filtered off, washed with water and dried (at 40° C.). Thus, 80.1 g of Photosensitive Material G was obtained.

Compound (c)

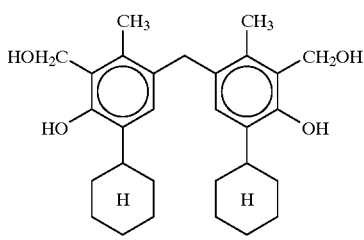

Compound (d)

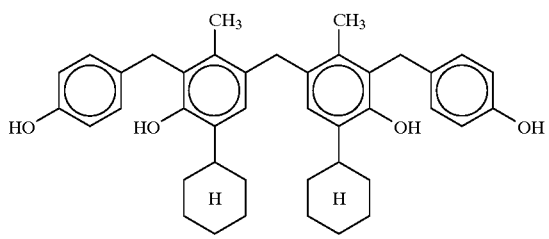

Synthesis Example 21

Synthesis of Photosensitive Material H:

According to the synthesis method described in JP-A-6-167805, the Compound (e) illustrated below was obtained. Triethylamine in an amount of 7.3 g was dropped into a mixture of 14.0 g of Compound (e), 16.1 g of 1,2-naphthoquinonediazide-5-sulfonyl chloride and 150 g of dioxane, and then the reaction was run for 6 hours at 30° C. The reaction mixture thus obtained was poured into 750 ml of a 1% water solution of hydrochloric acid to deposit a precipitate. The precipitate was filtered off, washed with water, and then dried (at 40° C.) to yield 21.1 g of Photosensitive Material H.

Compound (e)

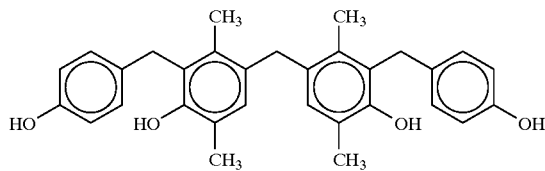

Preparation and Evaluation of Positive Working Photoresist Compositions

Each of photoresist compositions (Examples 1 to 20 and Comparative Examples 1 to 15) was prepared as follows:

(A) A novolak resin selected from Novolak Resins A to M obtained in the aforementioned Synthesis Examples 1 to 13 and Comparative Novolak Resins n to q and R to X obtained in the aforementioned Comparative Synthesis Examples 1 to 11

(B) A photosensitive material selected from Photosensitive Material A to H obtained in the aforementioned Synthesis Examples 14 to 21

(C) One or two polyhydroxy compounds selected from those shown in Table 6

The above ingredients (A) to (C) and one or two solvents selected from those shown in Table 5 were mixed in their respective proportions as set forth in Tables 7 and 8, and the resultant mixture was made into a homogeneous solution, and then the solution was passed through a microfilter made by Teflon having a pore size of 0.10 μm.

Each photoresist composition thus prepared was coated on a silicon wafer by means of a spinner, and dried at 90° C. for 60 seconds with a vacuum contact hot plate, thereby forming a resist film having a thickness of 0.97 μm.

Each resist film was exposed to light by means of a reducing projection exposure apparatus (Model NSR-2005i9C, made by Nikon), subjected to PEB (Post Exposure Bake) at 110° C. for 60 seconds, developed for 1 minute with a 2.38% of water solution of tetramethylammonium hydroxide, washed with water for 30 seconds, and then dried.

Each resist pattern thus obtained on the silicon wafer was observed under a scanning electron microscope, and thereby the resist performance was evaluated. The evaluation results are shown in Tables 9 and 10.

In the evaluation, the sensitivity is defined as the reciprocal of the exposure amount required for reproducing a 0.50 μm mask pattern, and shown as relative value, with the resist of Comparative Example 1 being taken as 1.0.

The resolution was expressed as the limiting resolution under the exposure for reproducing a 0.50 μm mask pattern.

The heat resistance was represented by the temperature of a vacuum contact hot plate at which it is possible to bake a resist pattern formed on a silicon wafer for 4 minutes without causing any pattern deformation.

The resist pattern shape is represented by an angle (θ) which the resist wall in the vertical section of a 0.50 μm resist pattern forms with the silicon wafer plane.

In evaluating the defocus latitude, the focus range in which a 0.40 μm resist pattern is resolved without a decrease in film thickness under the effective speed was examined by profile observation under a scanning electron microscope.

The development latitude is represented by the ratio of the effective sensitivity at the development time of 20 seconds to the effective sensitivity at the development time of 90 seconds, in which "1.0" means no difference in the sensitivity.

The development scum is represented by the extent of scum generated when a 0.50 μm resist pattern is formed. The case of generating no scum is symbolized by A, the case of generating some extent of scum by B, and the case of generating a good deal of scum by C.

TABLE 5

| | Solvents used for Evaluation |
|---|---|
| Symbol | Solvent Name |
| S-1 | Ethylene glycol monoethyl ether acetate |
| S-2 | Ethyl 2-hydroxypropionate |
| S-3 | Ethyl 3-methoxypropionate |
| S-4 | Ethyl 3-ethoxypropionate |
| S-5 | Propylene glycol monomethyl ether acetate |
| S-6 | 2-Heptanone |
| S-7 | Propylene glycol monomethyl ether propionate |
| S-8 | Butyl acetate |

TABLE 6

Compounds used as Additive

| Symbol | Compound Name |
|---|---|
| P-1 | 2,3,4-Trihydroxybenzophenone |
| P-2 | 2,3,4,3',4',5'-Hexahydroxybenzophenone |
| P-3 | Bis(4-hydroxyphenyl)sulfone |
| P-4 | 1,1-Bis(4-hydroxyphenyl)cyclohexane |
| P-5 | 2,6-Bis(4-hydroxy-2,5-dimethylbenzyl)-p-cresol |
| P-6 | α,α'α"-Tris(4-hydroxyphenyl)-1,3,5-triisopropylbenzene |
| P-7 | 4,4'-(1-α-Methylbenzylidene)bisphenol |
| P-8 | α,α',α"-Tris(4-hydroxyphenyl)-1-ethyl-4-isopropylbenzene |
| P-9 | 4,4'-[(2-Hydroxyphenyl)methylene]bis(3,5-methylphenol) |
| P-10 | α,α,α', α',α",α"-Hexakis-(4-hydroxyphenyl)-1,3,5-triethylbenzene |
| P-11 | 1,3,3,5-Tetra(4-hydroxyphenyl)pentane |

TABLE 7

Formula for Positive Working Photoresist Composition

| Example No. | Novolak Resin Species | Amount added* | Photosensitive Material Species | Amount added* | Polyhydroxy Compound Species | Amount added* | Solvent Species | Amount added* |
|---|---|---|---|---|---|---|---|---|
| 1 | A | 69 | C | 36 | P-7 | 31 | S-1 | 425 |
| 2 | B | 72 | C | 38 | P-8 | 28 | S-2 | 440 |
| 3 | C | 72 | D | 40 | P-9 | 28 | S-6 | 435 |
| 4 | D | 68 | D | 39 | P-4 | 32 | S-2/S-7 | 350/90 |
| 5 | E | 70 | E | 48 | P-8 | 30 | S-2 | 480 |
| 6 | F | 71 | E | 42 | P-5 | 29 | S-2/S-8 | 435/15 |
| 7 | G | 70 | F | 50 | P-3 | 30 | S-2/S-4 | 355/120 |
| 8 | H | 80 | F | 33 | P-6 | 20 | S-5 | 420 |
| 9 | I | 69 | G | 44 | P-8 | 31 | S-2 | 470 |
| 10 | J | 76 | G | 46 | P-4 | 24 | S-5/S-4 | 230/230 |
| 11 | K | 74 | H | 39 | P-11 | 26 | S-6 | 435 |
| 12 | L | 75 | H | 48 | P-6 | 25 | S-6 | 465 |
| 13 | M | 74 | D/H | 22/25 | P-10/P-11 | 13/13 | S-6 | 460 |
| 14 | F | 75 | C/E | 25/10 | P-5 | 25 | S-7 | 420 |
| 15 | A | 66 | F | 54 | P-8 | 34 | S-3 | 490 |
| 16 | B | 74 | G | 42 | P-4 | 26 | S-2/S-4 | 360/90 |
| 17 | E | 75 | E/G | 10/22 | P-11 | 25 | S-3 | 450 |
| 18 | G | 80 | F/G | 10/25 | P-10 | 20 | S-2/S-4 | 290/125 |
| 19 | J | 70 | B/G | 8/19 | P-8 | 30 | S-7 | 400 |
| 20 | L | 76 | E | 50 | P-4/P-10 | 14/10 | S-3 | 420 |

*parts by weight

TABLE 8

Formula for Positive Working Photoresist Composition

| Comparative Example No. | Novolak Resin Species | Amount added* | Photosensitive Material Species | Amount added* | Polyhydroxy Compound Species | Amount added* | Solvent Species | Amount added* |
|---|---|---|---|---|---|---|---|---|
| 1 | n | 100 | A | 25 | — | — | S-1 | 380 |
| 2 | o | 100 | A | 27 | — | — | S-1 | 385 |
| 3 | p | 100 | A | 30 | — | — | S-1 | 390 |
| 4 | q | 100 | A | 25 | — | — | S-2 | 390 |
| 5 | R | 85 | A | 25 | P-1 | 15 | S-2 | 390 |
| 6 | S | 90 | B | 42 | P-2 | 10 | S-2 | 450 |
| 7 | T | 75 | C | 40 | P-3 | 25 | S-2 | 420 |
| 8 | U | 85 | C | 30 | P-4 | 15 | S-2/S-8 | 380/15 |
| 9 | V | 69 | D | 40 | P-6 | 31 | S-3 | 440 |
| 10 | W | 66 | E | 42 | P-8 | 34 | S-3 | 450 |
| 11 | X | 69 | F | 50 | P-8 | 31 | S-5 | 475 |
| 12 | R | 77 | D | 34 | P-4 | 23 | S-6 | 420 |
| 13 | S | 77 | H | 34 | P-9 | 23 | S-5 | 420 |
| 14 | T | 72 | H | 29 | P-7 | 18 | S-2 | 390 |
| 15 | W | 84 | G | 24 | P-4 | 16 | S-6 | 380 |

*: parts by weight

TABLE 9

Evaluation Result of Resist Performance

| Example No. | Relative Sensitivity | Resolving Power ($\mu$m) | Heat Resistance (°C.) | Resist Profile ($\theta$) | Defocus Latitude | Development Latitude | Development Scum |
|---|---|---|---|---|---|---|---|
| 1 | 1.2 | 0.28 | 155 | 89 | 1.8 | 0.83 | A |
| 2 | 1.2 | 0.28 | 160 | 88 | 2.0 | 0.84 | A |
| 3 | 1.2 | 0.28 | 160 | 89 | 2.0 | 0.88 | A |
| 4 | 1.1 | 0.28 | 160 | 89 | 2.0 | 0.83 | A |
| 5 | 1.2 | 0.28 | 155 | 88 | 2.0 | 0.87 | A |
| 6 | 1.2 | 0.28 | 160 | 89 | 1.8 | 0.89 | A |
| 7 | 1.3 | 0.28 | 155 | 88 | 1.8 | 0.86 | A |
| 8 | 1.2 | 0.30 | 160 | 89 | 1.8 | 0.80 | A |
| 9 | 1.1 | 0.28 | 155 | 89 | 1.8 | 0.84 | A |
| 10 | 1.2 | 0.28 | 160 | 89 | 1.8 | 0.85 | A |
| 11 | 1.2 | 0.28 | 160 | 89 | 1.8 | 0.84 | A |
| 12 | 1.1 | 0.28 | 160 | 88 | 2.0 | 0.84 | A |
| 13 | 1.1 | 0.28 | 160 | 88 | 1.8 | 0.86 | A |
| 14 | 1.2 | 0.30 | 160 | 89 | 1.8 | 0.74 | A |
| 15 | 1.2 | 0.28 | 155 | 89 | 1.8 | 0.85 | A |
| 16 | 1.2 | 0.28 | 160 | 89 | 1.8 | 0.87 | A |
| 17 | 1.3 | 0.30 | 160 | 88 | 1.8 | 0.74 | A |
| 18 | 1.2 | 0.30 | 160 | 89 | 1.8 | 0.79 | A |
| 19 | 1.3 | 0.30 | 160 | 89 | 1.8 | 0.70 | A |
| 20 | 1.3 | 0.30 | 160 | 89 | 1.8 | 0.75 | A |

TABLE 10

Evaluation Result of Resist Performance

| Comparative Example No. | Relative Sensitivity | Resolving Power ($\mu$m) | Heat Resistance (°C.) | Resist Profile ($\theta$) | Defocus Latitude | Development Latitude | Development Scum |
|---|---|---|---|---|---|---|---|
| 1 | 1.0 | 0.40 | 145 | 83 | 0.2 | 0.50 | C |
| 2 | 1.2 | 0.40 | 145 | 84 | 0.2 | 0.55 | A |
| 3 | 1.2 | 0.40 | 145 | 84 | 0.2 | 0.57 | C |
| 4 | 0.9 | 0.37 | 150 | 84 | 0.4 | 0.67 | B |
| 5 | 1.2 | 0.37 | 150 | 83 | 0.4 | 0.65 | A |
| 6 | 1.3 | 0.35 | 160 | 86 | 0.8 | 0.67 | A |
| 7 | 1.2 | 0.32 | 155 | 87 | 1.0 | 0.66 | A |
| 8 | 1.1 | 0.30 | 155 | 88 | 1.2 | 0.63 | A |
| 9 | 1.2 | 0.30 | 155 | 88 | 1.2 | 0.67 | A |
| 10 | 1.0 | 0.30 | 160 | 89 | 1.4 | 0.70 | B |
| 11 | 0.9 | 0.35 | 145 | 86 | 0.8 | 0.73 | C |
| 12 | 1.0 | 0.32 | 150 | 87 | 1.0 | 0.62 | A |
| 13 | 1.1 | 0.30 | 150 | 87 | 1.4 | 0.61 | A |
| 14 | 1.2 | 0.30 | 155 | 87 | 1.4 | 0.60 | A |
| 15 | 0.9 | 0.30 | 155 | 88 | 1.2 | 0.60 | A |

In accordance with the present invention, as mentioned above, the positive working photoresist composition obtained has very wide development latitude and high heat resistance as it retains high resolution and wide defocus latitude, and that without accompanied by loss of sensitivity.

While the invention has been described in detail and with reference to specific embodiments thereof, it will be apparent to one skilled in the art that various changes and modifications can be made therein without departing from the spirit and scope thereof.

What is claimed is:

1. A positive working photoresist composition comprising:
   (A) an alkali-soluble novolak resin which is obtained by condensation reaction of the following phenol compounds (a), (b) and (c) with an aldehyde and has a Mw/Mn ratio of from 1.5 to 4.0, wherein Mw stands for a weight-average molecular weight and Mn stands for a number-average molecular weight, (a) 50 to 90 mol % of m-cresol, (b) 5 to 40 mol % of a phenol compound represented by the following formula (I),

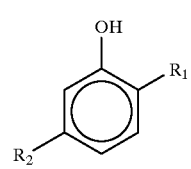

(I)

wherein $R_1$ and $R_2$ each represent a methyl group or an isopropyl group, and at least one of $R_1$ and $R_2$ is an isopropyl group, (c) 0 to 40 mol % of a phenol compound chosen from the compound represented by the following formula (II) or the compound represented by the following formula (III),

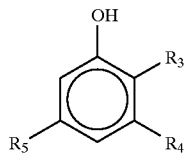

(II)

wherein $R_3$, $R_4$ and $R_5$ each represent a methyl group or a hydrogen atom, and at least two of $R_3$, $R_4$ and $R_5$ are methyl groups,

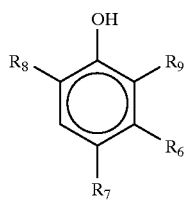

(III)

wherein $R_6$ represents a hydrogen atom or a methyl group, $R_7$ represents a methyl group or a methoxy group, and $R_8$ and $R_9$ each represents a hydrogen atom or a hydroxymethyl group, (B) a 1,2-naphthoquinonediazide-5-(and/or -4)sulfonic acid ester as a photosensitive compound in a proportion of from more than 30 to less than 100 parts by weight to 100 parts by weight of said novolak resin (A); and (C) a low molecular weight compound which contains from 12 to 50 carbon atoms in the molecule and has from 2 to 8 phenolic hydroxy groups in the molecule in a proportion of from 30 to 55 parts by weight to 100 parts by weight of said novolak resin (A).

2. The positive working photoresist composition as in claim 1, wherein the content of m-cresol in the phenol compounds is from 50 to 70 mol %.

3. The positive working photoresist composition as in claim 1, wherein the content of the phenol compound represented by formula (I) in the phenol compounds is from 10 to 35 mol %.

4. The positive working photoresist composition as in claim 1, wherein the content of the phenol compound represented by formula (II) or (III) in the phenol compounds is from 3 to 35 mol %.

5. The positive working photoresist composition as in claim 1, wherein said alkali-soluble novolak resin has a Mw/Mn ratio of from 2.0 to 3.5.

6. The positive working photoresist composition as in claim 1, wherein said alkali-soluble novolak resin has a weight-average molecular weight of from 2,000 to 20,000.

7. The positive working photoresist composition as in claim 1, wherein said alkali-soluble novolak resin has a weight-average molecular weight of from 3,000 to 15,000.

* * * * *